(12) United States Patent
Kiffe

(10) Patent No.: US 6,353,329 B1
(45) Date of Patent: Mar. 5, 2002

(54) INTEGRATED CIRCUIT TEST SOCKET LID ASSEMBLY

(75) Inventor: Heather Y. Kiffe, Austin, TX (US)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 09/524,699

(22) Filed: Mar. 14, 2000

(51) Int. Cl.$^7$ .............................................. G01R 31/02
(52) U.S. Cl. ..................................... 324/760; 324/755
(58) Field of Search ................................ 324/755, 760, 324/765; 439/66–70, 330–331; 165/80.3, 80.4

(56) References Cited

U.S. PATENT DOCUMENTS

| | | | |
|---|---|---|---|
| 4,554,505 A | * 11/1985 | Zachry | 324/755 |
| 5,247,250 A | 9/1993 | Rios | 324/158 |
| 5,322,446 A | 6/1994 | Cearley-Cabbiness | 439/73 |
| 5,427,536 A | 6/1995 | Peterson et al. | 439/71 |
| 5,451,165 A | 9/1995 | Cearly-Cabbiness et al. | 439/71 |
| 5,647,756 A | 7/1997 | Twigg et al. | 439/331 |
| 5,788,526 A | 8/1998 | Twigg et al. | 439/331 |
| 6,014,031 A | * 1/2000 | Infantolino | 324/755 |
| 6,191,599 B1 | * 2/2001 | Stevens | 324/760 |

FOREIGN PATENT DOCUMENTS

GB 2 262 384 A 6/1993 ........... H01L/23/48

* cited by examiner

Primary Examiner—Vinh P. Nguyen
(74) Attorney, Agent, or Firm—Darla P. Fonseca

(57) ABSTRACT

A test socket for integrated circuits includes a socket body for making electrical connection between leads or pads of an integrated circuit and a load board. A lid assembly is pivotally connected to the socket body by a hinge and is rotatable between a closed position and an open position. The lid assembly is removable from the socket body without tools. The lid assembly includes a frame member secured to the hinge, and a pressure plate and actuation member contained within the frame member. The bottom surface of the pressure plate includes a plurality of channels extending from an open central portion to the circumference of the pressure plate for permitting thermal air flow over the integrated circuit. A preferred embodiment of the lid assembly provides a visual indication to the user when an integrated circuit is undergoing testing.

19 Claims, 8 Drawing Sheets

INTEGRATED CIRCUIT TEST SOCKET LID ASSEMBLY

BACKGROUND OF THE INVENTION

The present invention pertains generally to devices that test integrated circuits, and more particularly to an improved test socket lid assembly which allows easier multi-site usage, improved thermal testing capabilities, and improved failure analysis testing capabilities. The improved socket and lid are easily adaptable for use with either automated testing or hand testing.

Critical integrated circuits are tested before being installed in a finished product. These integrated circuits are frequently incapsulated in ceramic or plastic packages that have contact pads or leads which are electrically connected to the integrated circuit. To test the integrated circuit, it is necessary to make temporary electrical connections to the contact pads or leads on the integrated circuit package. Test sockets created for this purpose are secured to printed circuit boards (load boards) having the appropriate circuitry for testing a particular integrated circuit.

Much of the testing of the integrated circuits may be done with automated equipment. The body of a test socket may be secured to the printed circuit board, and have a plurality of electrical contacts for making electrical connection between the circuitry of the printed circuit board and the contact pads or leads of the integrated circuit. The integrated circuit device is placed into the socket body such that the pads or leads of the integrated circuit contact the electrical contacts of the socket. Typically, the automated equipment which is used to place an integrated circuit into the socket also provides an actuation force against the integrated circuit to engage the integrated circuit pads or leads with the socket electrical contacts.

Automated testing of integrated circuits is not always feasible. This is particularly true when an automated process is not fully developed, or only a relatively small number of integrated circuits are to be tested and the cost of developing a fully automated system is not justified. Hand testing may also be used for special testing purposes, such as integrated circuit characterization tests, failure analysis tests, or thermal testing. In these situations, a lid must be used with the test socket body. The lid takes the place of the automated handling equipment and presses against the top of the integrated circuit to provide the actuation force for engaging the integrated circuit leads with the socket electrical contacts.

Because a user may desire to use a socket body for either automated or hand testing, it is desirable to have a test socket which is adaptable for use either with automated testing or with hand testing. In particular, it is desirable to have a test socket lid assembly which may be attached to a socket body during hand testing of integrated circuits, and which may be removed from the socket body when automated testing is to be done. In addition, it is desirable to have a test socket lid assembly which permits efficient testing of the integrated circuit for tests such as thermal testing, failure analysis, or integrated circuit characterization, as it is these types of tests which are most likely to be performed by hand.

Often, and particularly in automated testing, a user may test more than one device on a single load board. In such a situation, the test socket bodies may be placed side by side, and access to the outer edges of the socket bodies is restricted. In the future, as the automated testing equipment continues to improve and higher densities are possible, this arrangement will be even more common. To avoid interference between adjacent sockets, it would be desirable for all of the socket lid assembly components to be contained within the socket body footprint. Further, it would be desirable if the lid is attachable to the socket body even when the socket body is immediately adjacent another socket body.

As the number of leads or pads of the integrated circuit device increases, the force required to engage the integrated circuit pads or leads to the electrical contacts of the socket becomes large and a great deal of force must be applied to the top of the integrated circuit. It would be helpful to provide some means of obtaining a mechanical advantage in forcing the integrated circuit device downwardly into contact with the electrical contacts of the test socket. Depending upon the circumstances of the testing environment, it may be favorable to have two separate mechanisms: one for securing the lid in a closed position, and another for providing a mechanical advantage in forcing the integrated circuit towards the electrical contacts. In this manner, "pinching" of the integrated circuit can be avoided, and a true "vertical" actuation force may be applied to the integrated circuit.

Failure analysis is often performed by hand on integrated circuit devices. There are two primary methods of failure analysis: mechanical failure analysis and e-beam failure analysis. Both methods require that the top of the integrated circuit, or at least specific portions of the top of the integrated circuit, be removed to expose the conductive traces of the integrated circuit.

In mechanical failure analysis, the integrated circuit is placed in a test socket and a small probe is placed onto a lead trace. The probe is typically a long wire with a bent tip which tapers down to a very small diameter. To properly analyze the integrated circuit, a square tapered hole through the test socket lid assembly is preferred to provide adequate access to the traces. The hole in the test socket lid preferably is nearly as large as the integrated circuit itself to provide maximum access to the traces, while still providing enough downward force on the integrated circuit to provide secure electrical contact with the socket electrical contacts.

E-beam failure analysis places the integrated circuit in a test socket under an electron microscope. In e-beam analysis, maximum viewing access to the top of the integrated circuit is desired. In addition, the top surface of the lid assembly must be flat, without any portions of the socket or lid protruding above the plane of the lid. For these reasons, it is desirable to provide a lid for the test socket body which provides as large of an opening as possible for failure analysis, while still providing enough contact area against the integrated circuit to activate the device within the test socket.

Thermal testing of integrated circuits is important for properly characterizing the integrated circuits. Most thermal tests performed by hand last only a few minutes, although a small portion may last for several hours. Because most thermal tests last for only a short duration, the ability to bring the integrated circuit to operating temperature as quickly as possible is important. Unfortunately, most test socket designs do not provide adequate thermal air flow over the integrated circuit when the integrated circuit is in the test socket. Once the activation force is applied against the integrated circuit to electrically connect it with the load board, efficient thermal air flow is lost, as the pressure plate of the lid tends to block the air flow over the integrated circuit. This uneven flow of air creates hot and cold spots on the integrated circuit surface. As a result, accurate thermal testing of the integrated circuit is difficult or impossible. It is therefore desirable to have a test socket which provides efficient thermal air flow over the integrated circuit while the device is activated in the test socket.

It is thus desirable to provide a test socket assembly which is adaptable with either automated or hand testing, and which has improved capabilities for multi-site usage, as well as thermal and failure analysis testing.

SUMMARY OF THE INVENTION

The present invention is a test socket and lid assembly which provides improved multi-site usage, improved failure analysis capabilities, and improved thermal test capabilities. The test socket includes a socket body for making electrical connection between the leads or pads of the integrated circuit and the load board. A lid assembly utilizes a hinge that is removably attached to the socket body allowing the socket to be used with either automated or hand testing. The lid assembly includes a frame member which is pivotally secured to the hinge, with a pressure plate and actuation mechanism retained within the frame member by a cover plate. A latch member holds the lid assembly in a closed position when the test socket is in use. The pressure plate is actuated by the actuation mechanism to move the pressure plate between an unactivated position and an activated position in which the integrated circuit is urged into the socket body. The bottom surface of the pressure plate includes a plurality of channels extending from a central opening in the pressure plate to the circumference of the pressure plate. The channels allow thermal air flow over the integrated circuit for improved thermal performance and improved access to the integrated circuit.

The lid assembly may be attached to or moved from the socket body without the use of tools, even when a plurality of socket bodies are positioned are positioned immediately adjacent one another. In this manner, socket bodies may easily be adapted from automated testing to hand testing when required by the user.

The lid assembly is preferably provided with an actuation member which provides a visual indication to the user when the pressure plate is in an activated position and the enclosed integrated circuit is undergoing testing.

DETAILED DESCRIPTION OF THE INVENTION

Figure 1:
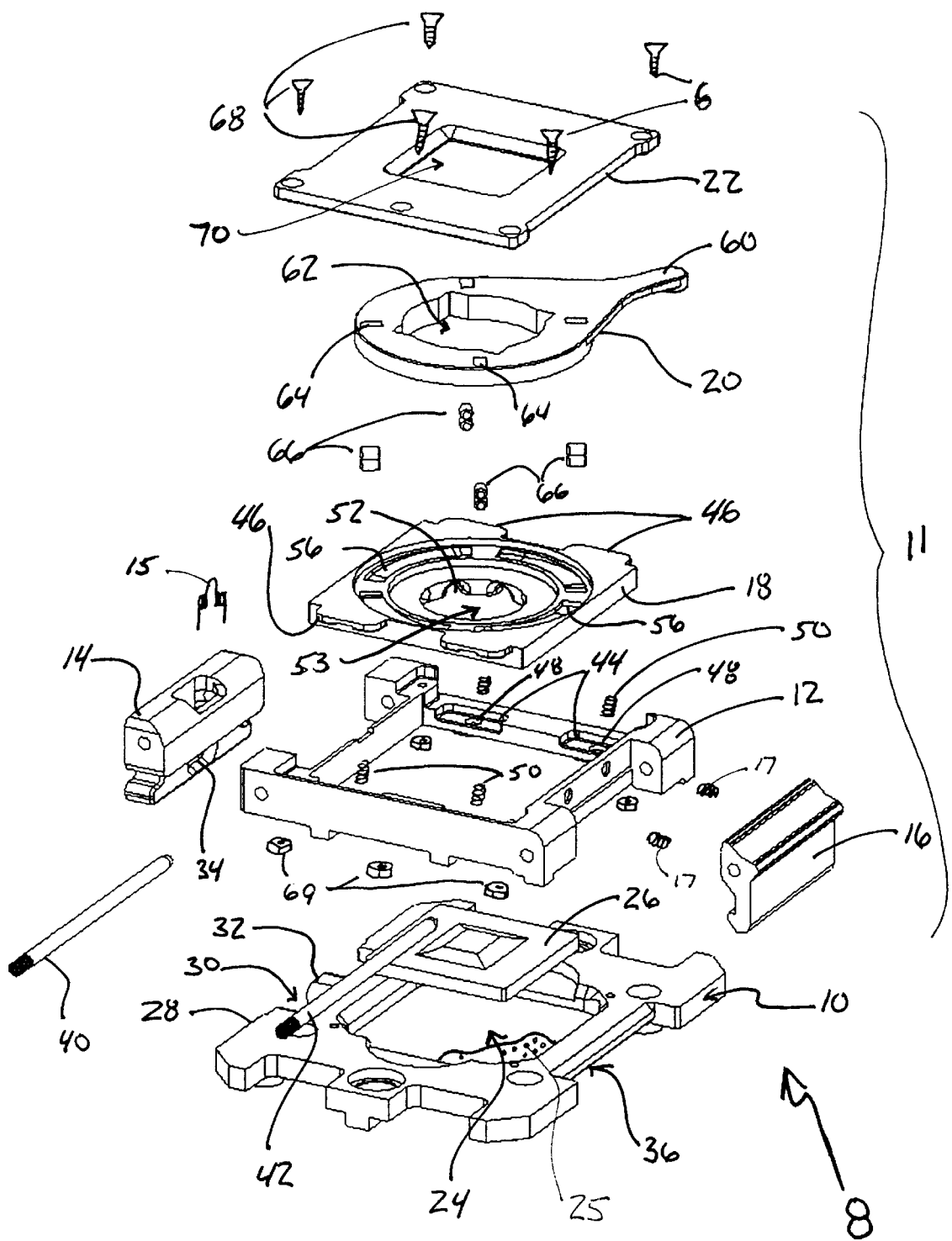
FIGS. 1–3 are exploded perspective views of the test socket and lid assembly of the present invention.
Figure 2:
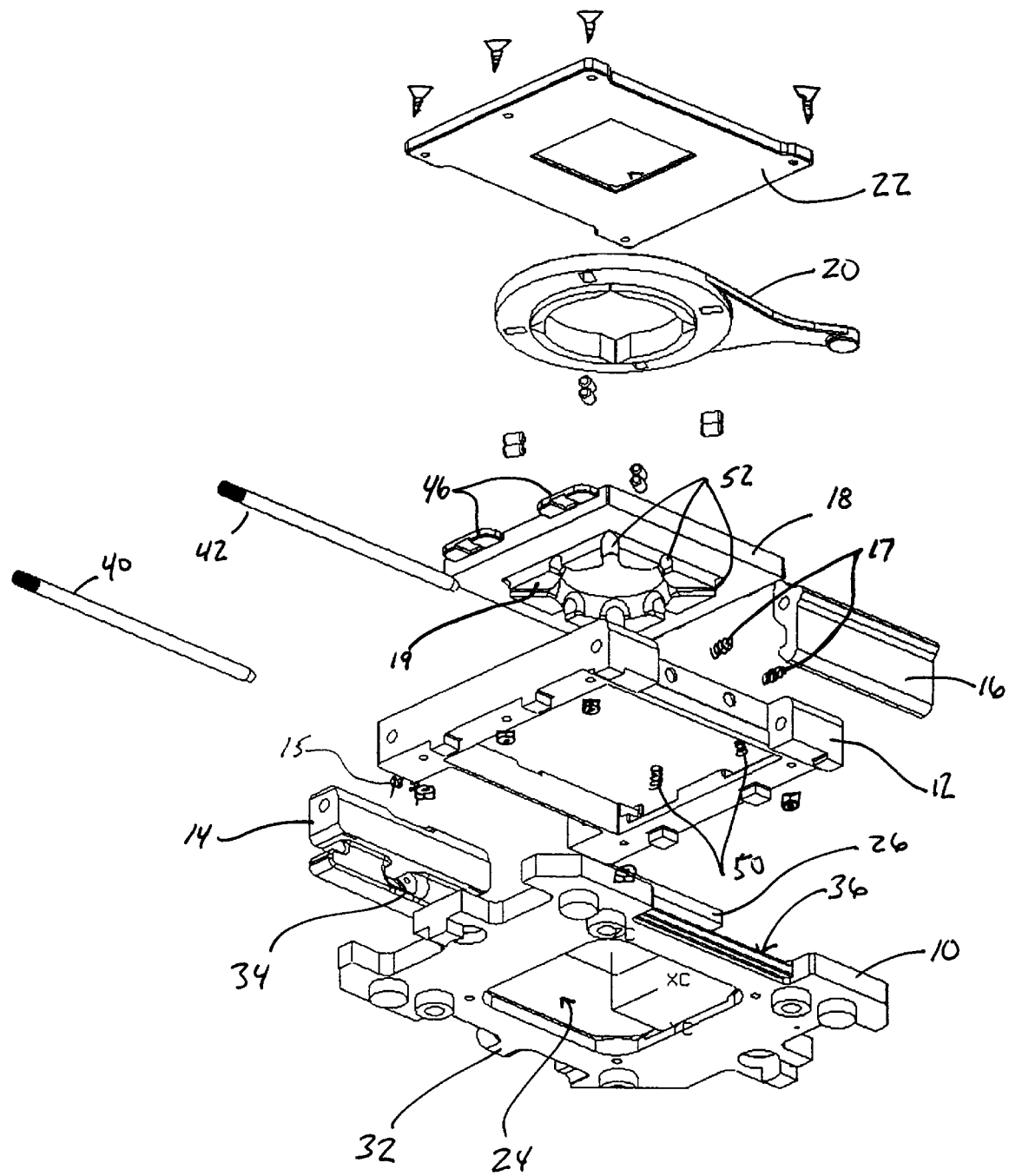
Figure 3:
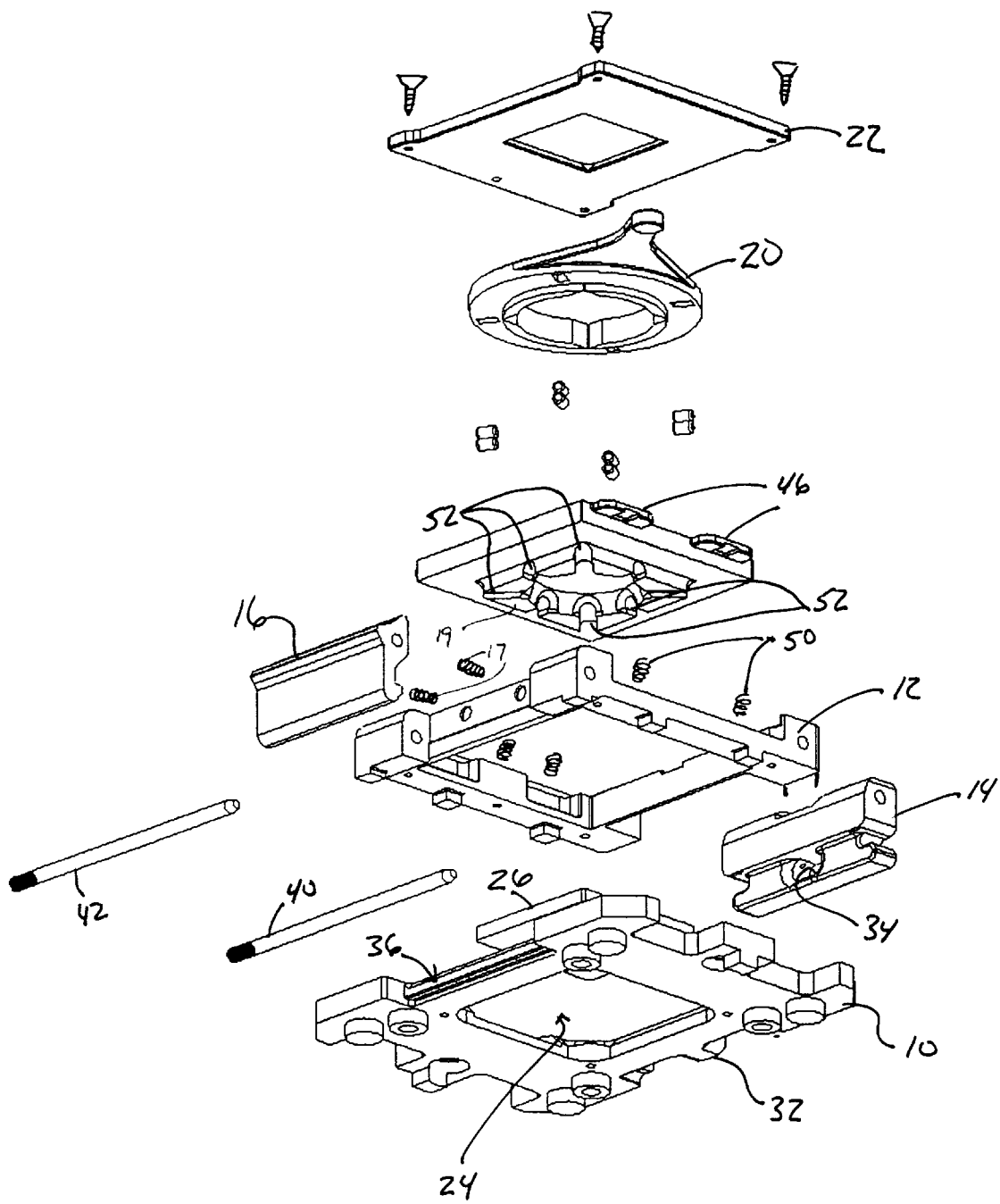
Figure 4:
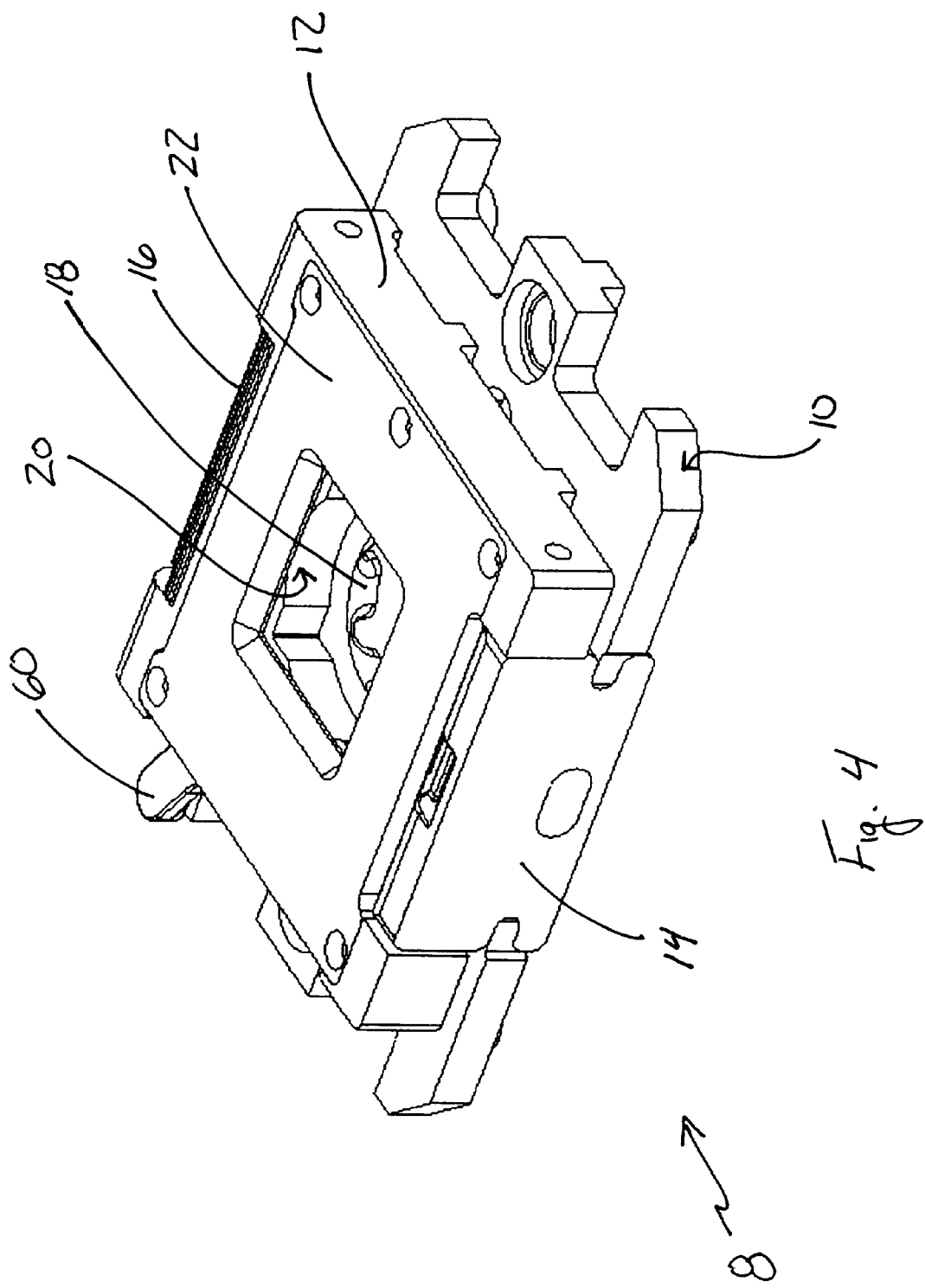
FIG. 4 is a perspective view of the inventive test socket and lid assembly in an assembled configuration.

Exploded views of the inventive test socket assembly 8 are shown in FIGS. 1–3, while an assembled view of the test socket assembly 8 is provided in FIG. 4. The test socket includes a socket body 10 for attachment to a printed circuit board (not shown), and a lid assembly 11 having a lid frame 12 which may be pivotally connected to socket body 10 by hinge 14 and secured in a closed position by latch 16. Frame 12 is adapted to receive a pressure plate 18 which is actuated by paddle 20. The pressure plate 18 and paddle 20 are held within frame 12 by cover 22. Each of these elements is discussed in greater detail below.

Socket body 10 is similar to socket bodies known in the art, such as the "Microtouch" test socket available from Minnesota Mining and Manufacturing Company, but is modified to provide adaptability for either automated or hand testing. Socket body 10 includes a central opening 24 for receiving an integrated circuit 26. When socket body 10 is secured to a load board (not shown) central opening 24 encloses electrical contacts 25 adapted to make electrical connection with the leads or pads of integrated circuit 26. Only a small area of contacts 25 are shown in FIG. 1. A variety of methods for providing electrical contacts 25 within central opening 24 are known in the art and may include, for example, spring contacts, pogo pins, conductive elastomers., stamped metal contacts, and metal foils. Any of these types of contacts may be used.

Socket body 10 includes along a first edge 28 a recessed portion 30 adapted to receive hinge 14. Hinge 14 and socket body 10 preferably engage in a press or snap fitting manner, so that hinge 14 and socket body 10 may be engaged and disengaged easily by the user without the use of tools. For additional stability between hinge 14 and socket body 10, it may desired to provide socket body 10 with a protrusion 32 which extends into an opening 34 in hinge 14.

Opposite from edge 28, socket body 10 is provided a recessed latch pocket 36 for engagement with latch 16. By providing recessed latch pocket 36, latch 16 may engage socket body 10 without extending beyond the footprint of socket body 10 and interfering with surrounding sockets. This may be seen from FIG. 5 which shows two socket bodies 10, 10' positioned immediately adjacent each other. It can be seen in FIG. 5 that latch pocket 36' allows the hinge 14 to be attached to socket body 10 even when multiple socket bodies 10, 10' are positioned immediately adjacent each other. Hinge 14 may be simply slid into the space provided by latch pocket 36' of adjacent socket body 10' and then secured within recessed portion 30 of socket body 10.

Frame 12 is pivotally secured to hinge 14 so that the lid assembly 11 may be moved between opened and closed positions. In the figures, frame 12 is connected to hinge 14 by pin 40. However, frame 12 could be pivotally attached to hinge in any other manner known in the art such as by providing the mating surfaces of hinge 14 and frame 12 with interlocking ball joints which allow pivoting movement between the components. Opposite hinge 14 on frame 12, latch 16 is also pivotally attached to frame 12. Again, frame 12 and latch 16 may be connected using a pin 42, or by any other suitable means known in the art. Latch 16 secures frame 12 in a closed position to socket body 10 by engaging latch pocket 36 of socket body 10. Lid assembly 11 is preferably biased toward an open position, such as by torsion spring 15. Similarly, latch 16 is preferably biased by springs 17 toward a latching position.

Contained within the perimeter of lid frame 12 is pressure plate 18 and paddle 20. Pressure plate 18 and paddle 20 cooperate to force the pads of integrated circuit 26 toward the load board to make electrical contact with the load board. Frame 12 includes pocket recesses 44 which receive ears 46 of pressure plate 18. Bores 48 in the recesses 44 receive biasing springs 50. Springs 50 function to lift the pressure plate 18 away from the integrated circuit 26 until the device is activated by the user moving paddle 20.

Figure 6:
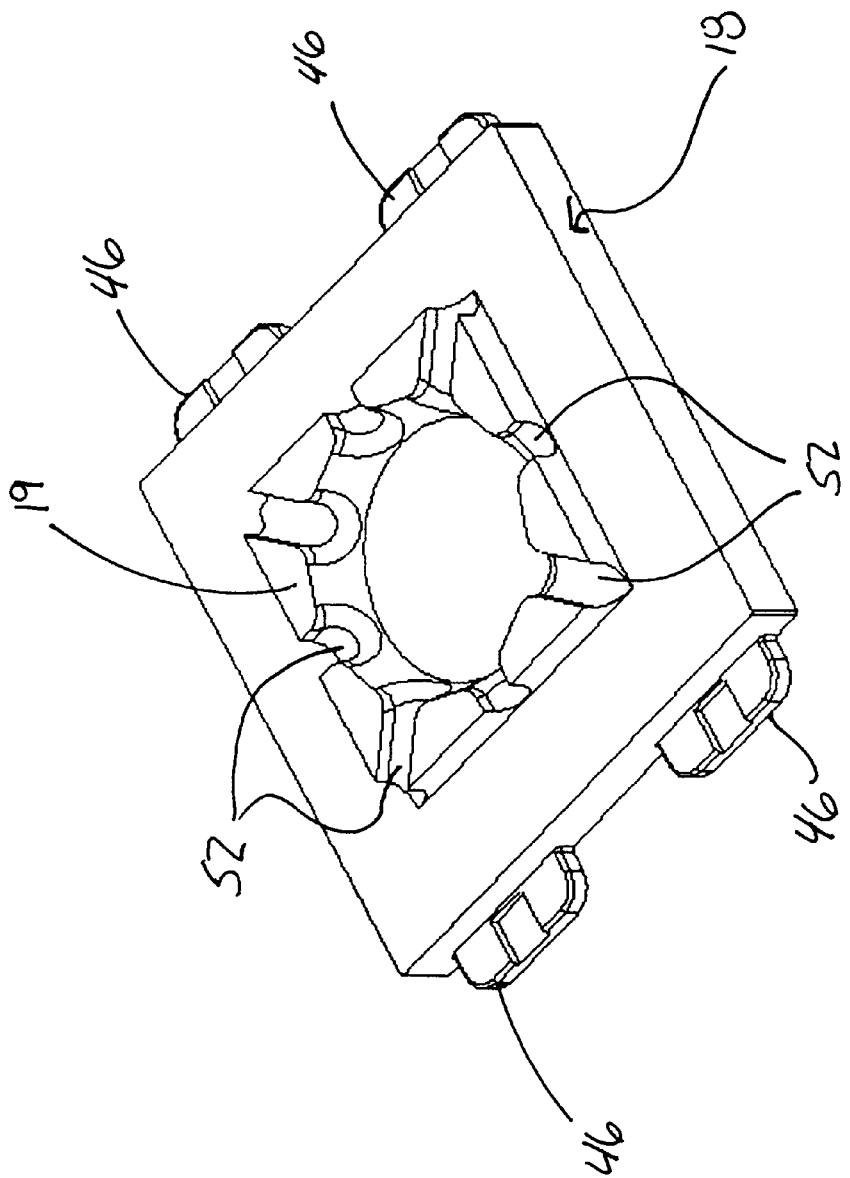
FIG. 6 is an enlarged perspective view of the pressure plate of the present invention.

As seen in FIG. 6, pressure plate 18 includes on its bottom surface 19 flat surfaces lying in a plane to contact the upper surface of integrated circuit 26 (the surface opposite the integrated circuit pads or leads). The bottom surface 19 of pressure plate 18 includes a plurality of thermal air flow channels 52 which permit air to flow freely over the surface of integrated circuit 26. The air flow channels 52 extend from the outer edge of pressure plate 18 to a central opening 53. The central opening 53 of pressure plate 18 is preferably countersunk to reduce any high pressure zones which may develop as a result of the restricted air flow passing through air flow channels 52. The even thermal air flow provides improved thermal testing capabilities when using the lid assembly 11. It will be recognized by others skilled in the art that other effective arrangements of holes and air flow passages in addition to that shown in the figures may be provided in pressure plate 18.

On the opposite side of pressure plate 18 from air flow channels 52, pressure plate 18 is formed with a plurality of arcuate inclined ramps or cammed surfaces 56. Positioned above the ramped surface 56 of the pressure plate 18 is paddle 20 in the form of a flat disk having a lever 60 extending radially outward from one edge.

The paddle 20 has a central opening 62 which aligns with opening 53, and spaced slots 64 positioned above the ramped surfaces 56. The slots 64 each receive a pair of cylindrical rollers 66 which engage the ramps 56 and afford vertical movement of the pressure plate 18 upon rotation of the paddle 20. Cover plate 22 is fastened to the frame 12 by screws 68 and nuts 69 to resist the upward movement of the rollers 66, thus transferring the rotational movement of the paddle 20 and rollers 66 into vertical movement of the pressure plate 18 through the ramps 56 and against the biasing springs 50. The vertical movement of pressure plate 18 drives the integrated circuit 26 against the electrical contacts of the load board. Cover plate 22 includes opening 70 which aligns with openings 53, 62 of pressure plate 18 and paddle 20, respectively, to allow for thermal air flow over integrated circuit 26.

The mechanical advantage provided by using actuation paddle 20 and pressure plate 18 allows integrated circuits having a much larger number of contacts to be tested in the inventive socket. This is because additional contacts increase the spring force required to adequately engage the integrated circuit with the load board. The current design provides an actuation force of up to 120 lbs. This is much greater than most of currently available sockets are capable of testing.

Figure 5:
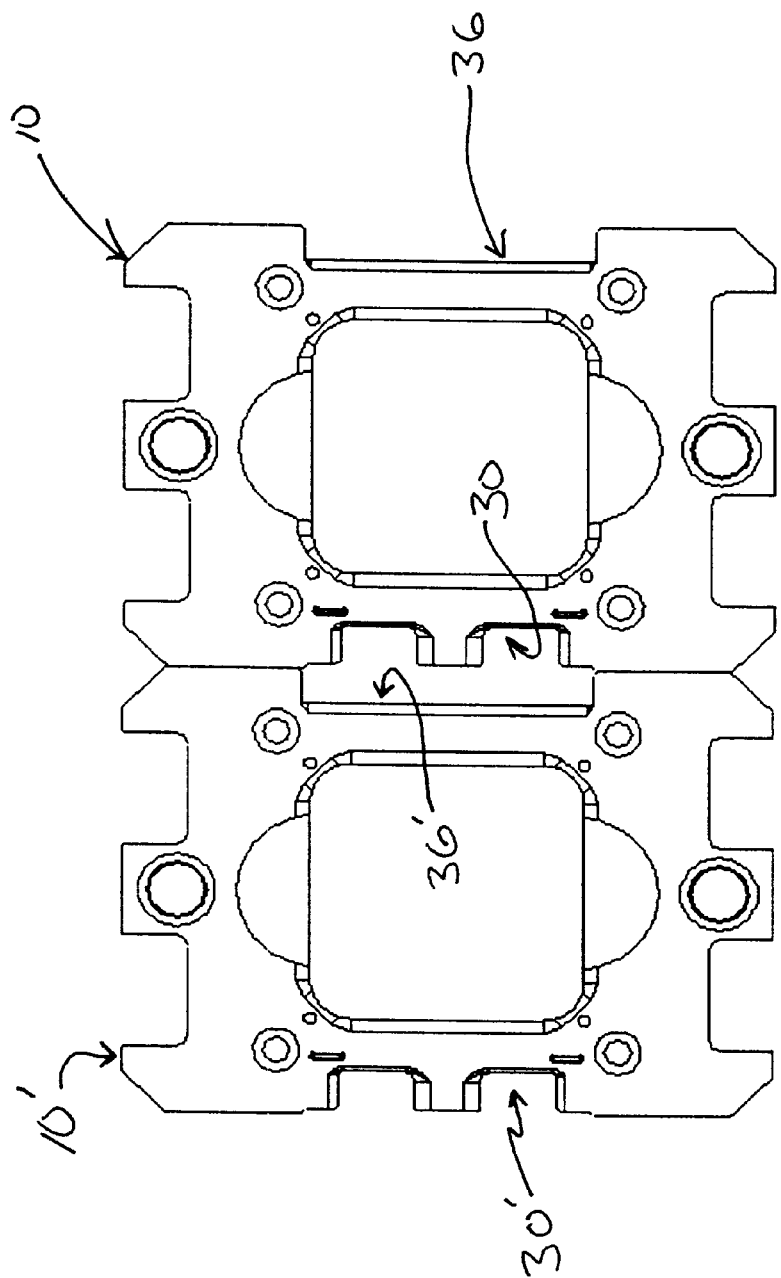
FIG. 5 is a top plan view of two socket bodies of the invention positioned immediately adjacent each other.
Figure 7:
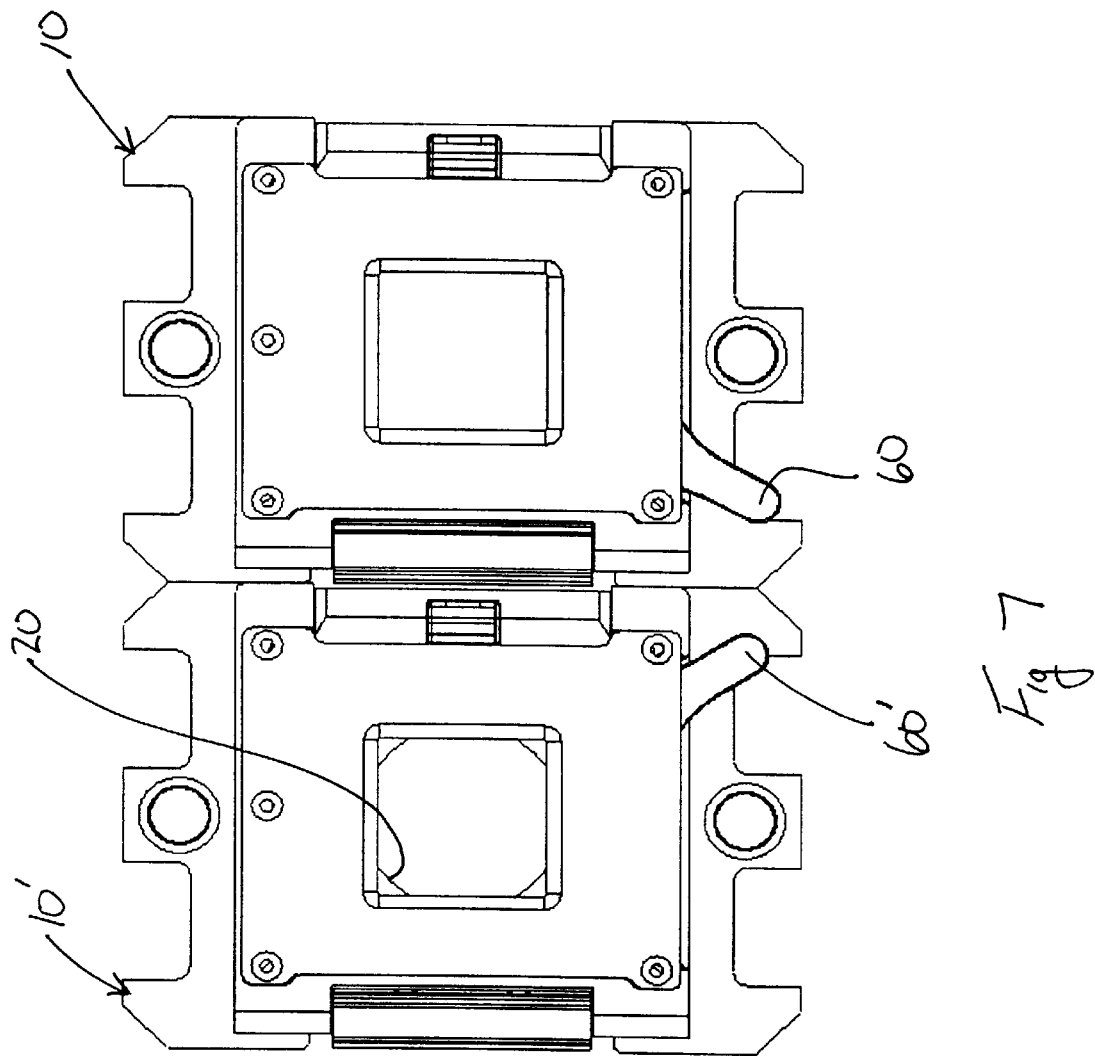
FIG. 7 is a perspective view of two inventive socket assemblies positioned adjacent each other, with one socket in the test position and the other socket in the non-test position.
Figure 8:
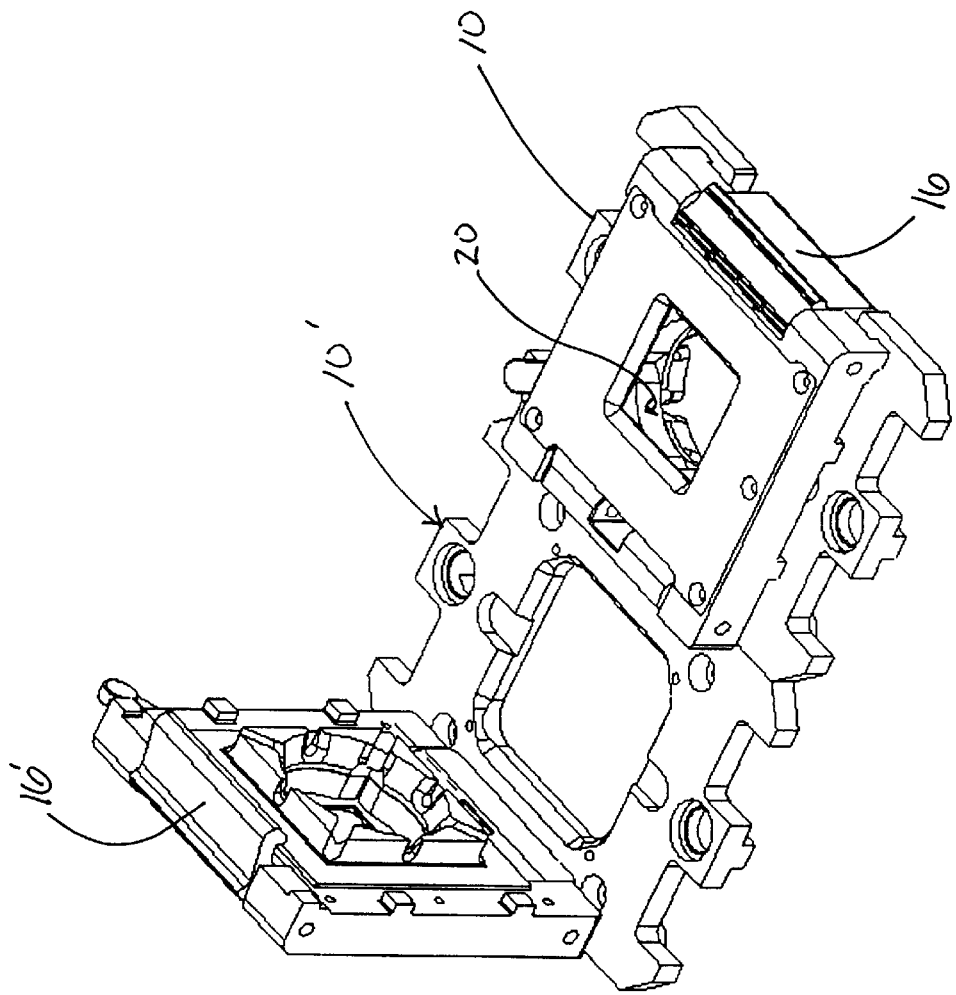
FIG. 8 is a perspective view of two inventive socket assemblies positioned adjacent each other, with one socket opened for receiving an integrated circuit.

The test socket lid assembly 11 of the present invention provides several advantages over currently available and prior art test socket lids. The invention is capable of accommodating multi-site testing, failure analysis and thermal testing. Multi-site testing (required when multiple socket bodies 10, 10' are placed side by side, as seen in FIGS. 5, 7 and 8) may be accomplished because the recessed portion 30 and latch pocket 36, of adjacent socket bodies 10, 10' which align when two socket bodies are placed side by side (see FIG. 5) and allow the hinge 14 to be attached to the socket body 10 without requiring removal of either socket body 10, 10' from the load board, or without interfering with adjacent sockets. The latch member 16 is also contained within the footprint of the socket body 10, allowing the lid assembly to be installed and uninstalled without access to the outside edges of the socket body and without interfering with adjacent socket bodies.

Thermal testing of integrated circuits 26 is greatly improved with the provision of air flow channels 52 in pressure plate 18 and openings 53, 62, 70 in the pressure plate 18, paddle 20 and cover 22, respectively. The evenly spaced air flow channels provide a more constant temperature over integrated circuit 26, and additionally provide greater access to the surface of integrated circuit 26. This improved access to upper surface of integrated circuit 26 is important not only in thermal testing, but in failure analysis as well. The channels 52 further facilitate failure analysis by providing increased access to the top of the integrated circuit. Also, no portion of the socket or lid assembly 11 extends above the upper surface of cover 22.

The paddle 20 is preferably designed to provide a unique visual indicator to aid the user in determining whether the test socket is in use. The "no test" position is when no actuation force is applied to the integrated circuit device and electrical connection with the load board has not been established. The "test" position indicates that the actuation force has been applied and electrical connection has been established with the load board. As shown in the Figures, opening 62 in paddle 20 is shaped such that in the no test position, the hole through the lid assembly 11 appears octagonal in shape. This is because the opening 62 in paddle 20 is shaped such that when the paddle 20 is in the open position, the inner diameter of the paddle opening 62 closes off the corners on the square opening 70 in cover 22. However, when paddle 20 is rotated to the test position, the paddle opening 62 is shaped such that the body of paddle 20 no longer interferes with the corners of opening 70 in cover 22 and the opening through lid assembly 11 thus appears square in shape. A top view of two socket assemblies are shown in FIG. 7. The socket on the left is shown in the non-test position (designated by the octagonal opening through the lid) while the socket on the right is in the test position (indicated by the square hole through the lid). This visual indicator allows the user to easily identify whether the device in the socket is under test, and prevents inadvertent opening of the device during a test cycle. Of course, opening 62, 70 of paddle 20 and cover 22 may be shaped in a manner different than that shown and described above to create a different, but equally effective visual indicator to the user.

As can be seen from the above description and the accompanying drawings, the integrated circuit test socket and lid assembly described herein provides numerous advantages, including improved multi-site usage, improved thermal testing capabilities, and improved failure analysis testing abilities. It will be recognized by those skilled in the art that various modifications may be made to the invention described herein without departing from the scope and spirit of the invention. For example, hinge 14 could be replaced with a second latch member 16 to secure lid assembly 11 to socket body 10. Accordingly, the claims should be interpreted with their broadest possible meaning.

What is claimed is:

1. An improved test socket lid assembly for integrated circuit test sockets, the lid assembly comprising:

a hinge removably secured to a socket body;

a frame member pivotally secured to the hinge and rotatable between a closed position and an open position;

a pressure plate positioned within the frame member, the pressure plate movable between an unactivated position and an activated position where a bottom surface of the pressure plate contacts an integrated circuit and urges the integrated circuit into the socket body, the pressure plate having an open central portion and a plurality of channels on its bottom surface, the channels extending from the open central portion to the circumference of the pressure plate for permitting thermal air flow over the integrated circuit; and a cover member attached to the frame member for retaining the pressure plate within the frame member, the cover member having a central opening which aligns with the open central portion of the pressure plate, thereby allowing thermal air flow to occur over the integrated circuit and allowing viewing of the integrated circuit.

2. The lid assembly of claim 1, further comprising an actuation member for moving the pressure plate between its unactivated position and its activated position.

3. The lid assembly of claim 2, wherein the actuation member engages a cammed surface on the top surface of the pressure plate.

4. The lid assembly of claim 3, wherein the actuation member is a flat disk having a lever extending radially outward from its circumference, the flat disk having cylindrical rollers which engage the cammed surface of the pressure plate upon rotation of the disk.

5. The lid assembly of claim 2, wherein the actuation member is positioned between the pressure plate and the cover member, the actuation member including a central opening aligned with the central openings of the pressure plate and the cover member.

6. The lid assembly of claim 5, wherein the central opening of the actuation member is shaped such that it interacts with the opening in the cover member to provide a visual indication of when the pressure plate is in an activated position.

7. The lid assembly of claim 1, further comprising a latch member for securing the frame member in a closed position.

8. The lid assembly of claim 1, wherein the hinge is secured to or removed from the socket body without tools.

9. An improved test socket for integrated circuits, the test socket comprising:

a socket body for making electrical connection between leads or pads of an integrated circuit and a load board;

a lid assembly pivotally connected to the socket body by a hinge and rotatable between a closed position and an open position, the lid assembly including:

a frame member pivotally secured to the hinge;

a pressure plate positioned within the frame member, the pressure plate movable between an unactivated position and an activated position where a bottom surface of the pressure plate contacts an integrated circuit and urges the integrated circuit into the socket body, the pressure plate having an open central portion and a plurality of channels on its bottom surface, the channels extending from the open central portion to the circumference of the pressure plate for permitting thermal air flow over the integrated circuit; and a cover member attached to the frame member for retaining the pressure plate within the frame member, the cover member having a central opening which aligns with the open central portion of the pressure plate, thereby allowing thermal air flow to occur over the integrated circuit and allowing viewing of the integrated circuit.

10. The socket of claim 9, wherein the hinge is removably secured to the socket body.

11. The socket of claim 10, wherein the hinge may be secured to or removed from the socket body without tools.

12. The socket of claim 11, wherein the hinge may be secured to or removed from the socket body when the socket body is immediately adjacent another socket body.

13. The socket of claim 9, further comprising an actuation member for moving the pressure plate between its unactivated position and its activated position.

14. The socket of claim 13, wherein the actuation member engages a cammed surface on the top surface of the pressure plate.

15. The socket of claim 14, wherein the actuation member is a flat disk having a lever extending radially outward from its circumference, the flat disk having cylindrical rollers which engage the cammed surface of the pressure plate upon rotation of the disk.

16. The socket of claim 13, wherein the actuation member is positioned between the pressure plate and the cover member, the actuation member including a central opening aligned with the central openings of the pressure plate and the cover member.

17. The socket of claim 16, wherein the central opening of the actuation member is shaped such that it interacts with the opening in the cover member to provide a visual indication of when the pressure plate is in an activated position.

18. The socket of claim 9, further comprising a latch member for securing the frame member in a closed position.

19. The socket of claim 9, wherein the lid assembly is contained within the footprint of the socket body.

* * * * *